United States Patent
Kummerl et al.

(10) Patent No.: US 12,087,859 B2
(45) Date of Patent: Sep. 10, 2024

(54) METHOD FOR IMPROVING TRANSISTOR PERFORMANCE

(71) Applicant: Texas Instruments Incorporated, Dallas, TX (US)

(72) Inventors: Steven Kummerl, Carrollton, TX (US); Matthew John Sherbin, Dallas, TX (US); Saumya Gandhi, Irving, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 333 days.

(21) Appl. No.: 16/589,951

(22) Filed: Oct. 1, 2019

(65) Prior Publication Data
US 2020/0035833 A1    Jan. 30, 2020

Related U.S. Application Data

(63) Continuation of application No. 15/136,097, filed on Apr. 22, 2016, now Pat. No. 10,431,684.

(51) Int. Cl.
*H01L 29/78*  (2006.01)
*H01L 21/268*  (2006.01)
(Continued)

(52) U.S. Cl.
CPC ........ *H01L 29/7849* (2013.01); *H01L 21/268* (2013.01); *H01L 21/324* (2013.01);
(Continued)

(58) Field of Classification Search
None
See application file for complete search history.

(56) References Cited

U.S. PATENT DOCUMENTS

| | | | | |
|---|---|---|---|---|
| 3,576,478 A | * | 4/1971 | Watkins | H01L 21/00 257/380 |
| 3,964,941 A | * | 6/1976 | Wang | H01L 27/00 438/154 |

(Continued)

FOREIGN PATENT DOCUMENTS

| | | |
|---|---|---|
| CN | 102468153 A | 5/2012 |
| CN | 103489779 A | 1/2014 |

(Continued)

OTHER PUBLICATIONS

Yang, Jae-Seok, et al., "TSV stress aware timing analysis with applications to 3D-IC layout optimization", Proceedings of the 47th Design Automation Conference; ACM, Jun. 13-18, 2010, pp. 803-806.

(Continued)

*Primary Examiner* — Brett A Feeney
*Assistant Examiner* — Stanetta D Isaac
(74) *Attorney, Agent, or Firm* — Dawn Jos; Frank D. Cimino

(57) ABSTRACT

A method to improve transistor performance uses a wafer (100) of single-crystalline semiconductor with a first zone (102) of field effect transistors (FETs) and circuitry at the wafer surface, and an infrared (IR) laser with a lens for focusing the IR light to a second depth (112) farther from the wafer surface than the first depth of the first zone. The focused laser beam is moved parallel to the surface across the wafer to cause local multi-photon absorption at the second depth for transforming the single-crystalline semiconductor into a second zone (111) of polycrystalline semiconductor with high density of dislocations. The second zone has a height and lateral extensions, and permanently stresses the single-crystalline bulk semiconductor; the stress (Continued)

increases the majority carrier mobility in the channel of the FETs, improving the transistor performance.

16 Claims, 3 Drawing Sheets

(51) Int. Cl.
*H01L 21/324* (2006.01)
*H01L 21/78* (2006.01)
*H01L 29/04* (2006.01)
*H01L 29/16* (2006.01)

(52) U.S. Cl.
CPC .............. *H01L 21/78* (2013.01); *H01L 29/04* (2013.01); *H01L 29/16* (2013.01)

(56) References Cited

U.S. PATENT DOCUMENTS

| | | |
|---|---|---|
| 5,442,223 A | 8/1995 | Fujii |
| 6,333,532 B1 | 12/2001 | Davari et al. |
| 2004/0053452 A1 | 3/2004 | Hasegawa et al. |
| 2004/0075142 A1 | 4/2004 | Matsuhashi |
| 2006/0284250 A1 | 12/2006 | Hsu et al. |
| 2011/0256736 A1 | 10/2011 | Cho et al. |
| 2012/0086076 A1* | 4/2012 | Takei .................. H01L 29/7811 257/341 |
| 2012/0248621 A1* | 10/2012 | Sadaka ................. H01L 23/481 257/774 |
| 2013/0175534 A1 | 7/2013 | Chung et al. |
| 2015/0187942 A1 | 7/2015 | Zhu et al. |
| 2016/0093534 A1 | 3/2016 | Kriebel et al. |
| 2016/0308032 A1* | 10/2016 | Glass .................. H01L 29/7849 |

FOREIGN PATENT DOCUMENTS

| | | | | |
|---|---|---|---|---|
| EP | 2800138 A1 * | 11/2014 | ....... | H01L 21/26506 |
| WO | 2015017097 A1 | 5/2015 | | |

OTHER PUBLICATIONS

CN Office Action dated Mar. 12, 2021.
CN Office Action mailed Nov. 10, 2021.

* cited by examiner

METHOD FOR IMPROVING TRANSISTOR PERFORMANCE

This application is a continuation of U.S. patent application Ser. No. 15/136,097, filed Apr. 22, 2016, the contents of all which are herein incorporated by reference in its entirety.

FIELD

Embodiments of the invention are related in general to the field of semiconductor devices and processes, and more specifically to the structure and fabrication method of creating intrinsic semiconductor lattice strain to increase carrier mobility and enhance field effect transistor performance.

DESCRIPTION OF RELATED ART

When a body of a semiconductor such as silicon is in contact with another solid state material, stress in the semiconductor may usually be caused by one of two situations: Stress may be caused by a mismatch of the coefficients of thermal expansion (CTE) between the two materials, or stress may be caused by differences of the lattice constants of the two bodies.

It is known that mechanical stress, when applied to a semiconductor lattice, leads to splitting of the conduction band and thus alters the effective mass of the majority carrier, leading to changes of the carrier mobility. For nMOS field effect transistors (FETs) with electrons as majority carriers, tensile stress to the channel lattice enhances the electron mobility in the channel. For pMOS FETs with holes as majority carriers, compressive stress to the channel lattice enhances the hole mobility in the channel. In both examples, the improvement of the carrier mobility leads to a decrease of the on-resistance between drain and source ($R_{DSon}$) and thus to improved FET efficiency. One frequently practiced technique to achieve such improved FET performance is the deposition of tensile silicon nitride layers on nMOS transistors, and compressive silicon nitride layers in pMOS transistors.

The effect that localized stress near the channel of a field effect transistor can result in improved electrical performance has been put to practice in the last few years by the production of semiconductor devices having a need for through-silicon vias (TSVs). The fabrication of TSVs starts while the device chips are still in un-thinned wafer form. A plurality of holes distributed across each chip area in the desired pattern is etched with uniform diameter and to a certain depth. The etching may be performed by chemical etching or be focused laser light. Then, a dielectric compound such as silicon nitride or silicon dioxide is deposited on the TSV sidewalls in order to create a thin insulating layer between the semiconductor material and the intended conductive layers inside the TSV. Next, a metal seed layer (such as tantalum nitride or a refractory metal) is deposited on the insulating layer, followed by the deposition of the thicker metal filling (preferably copper). Thereafter, the wafer is thinned, by grinding or etching or both, until the bottom of the via holes are exposed and the TSVs are opened. The conductive via may be closed off by a solderable layer of nickel and palladium.

While the stress caused by the TSVs may result in large keep-out zones for three-dimensional integrated circuits (ICs), recent studies of TSV placements have resulted in stress-aware layouts to help IC transistors to benefit from the enhanced carrier mobility in the stress zones. For instance, a study by Yang et al., based upon mobility dependence on stress and orientation between FET channel and TSV, showed how the optimum placement of TSVs can help improve the majority charge carrier mobility and thus result in improved transistor performance (see Yang, Jae-Seok, et al., "TSV stress aware timing analysis with applications to 3D-IC layout optimization", Proceedings of the 47$^{th}$ Design Automation Conference; ACM, Jun. 13-18, 2010, pp. 803-806).

SUMMARY

The intrinsic resistance of a field effect transistor (FET) is critical for performance. Decreasing the intrinsic resistance, usually the on-resistance of the channel between source and drain of a field effect transistor, increases the transistor efficiency. Since it is known that localized stresses near a transistor may result in improved electrical performance by enhancing majority carrier mobility, applicants realized that numerous semiconductor products could be improved if a—preferably low cost—method could be found to create such localized stress in all places of the product, where field effect transistors operate.

Applicants solved the problem of creating an intrinsic strain near an FET in a semiconductor chip and thus an increased mobility of the FET majority carrier in the gate channel, when they discovered a technique of using the focused energy of an infrared stealth laser to form optical damage by multi-photon absorption in a location determined by the position of the laser focus. The multi-photon absorption produces a region of amorphous poly-semiconductor near an FET.

By moving the focused laser parallel to the chip surface, a zone of amorphous semiconductor is created. The amorphous poly-semiconductor creates a permanent intrinsic strain in the single-crystalline lattice near the FET structure. The strain in turn increases the mobility of the majority carrier in the gate channel of the FET.

The concept of the solution is the use of a focused infrared laser light moving along a direction to create at the depth of the focus an embedded precise layer of amorphous poly-semiconductor, which permanently stresses the single-crystalline bulk semiconductor and thus increases the majority carrier mobility in the channel of a field effect transistor.

In the process flow, a wafer of single-crystalline semiconductor material such as silicon is provided; the wafer has a surface and includes a plurality of chips with field-effect transistors and integrated circuitry; the circuitry extends to a first depth from the surface. In addition, an infrared (IR) laser is selected so that its wavelength can be focused to a second depth greater than the first depth and allows a high percentage of the focused energy to be absorbed by the single-crystalline semiconductor lattice without ablation. The preferred wavelength range for the operation is between 900 nm and 1000 nm, allowing an integral transmittance between about 50% and 70%. The absorbed energy can then transform the single-crystalline semiconductor lattice into an amorphous polycrystalline region with high density of dislocations.

After focusing the IR laser to the second depth, where the optical damage by multi-photon absorption creates modification of the single-crystalline semiconductor into polycrystalline material with a high density of dislocations, the focused beam is moved parallel to the surface across the wafer. The moving local multi-photon absorption at the second depth forms a zone of the polycrystalline semiconductor. Zones of various extension may be created. The movement may be repeated until a polycrystalline zone of about 30 μm height is created. The polycrystalline zone creates an intrinsic permanent strain in the single-crystalline lattice near the FET structures, which in turn results in increased mobility of the majority device carriers and thus a more efficient FET performance, for instance by lowering the $R_{DSon}$ resistance.

DETAILED DESCRIPTION OF THE PREFERRED EMBODIMENTS

Figure 1:
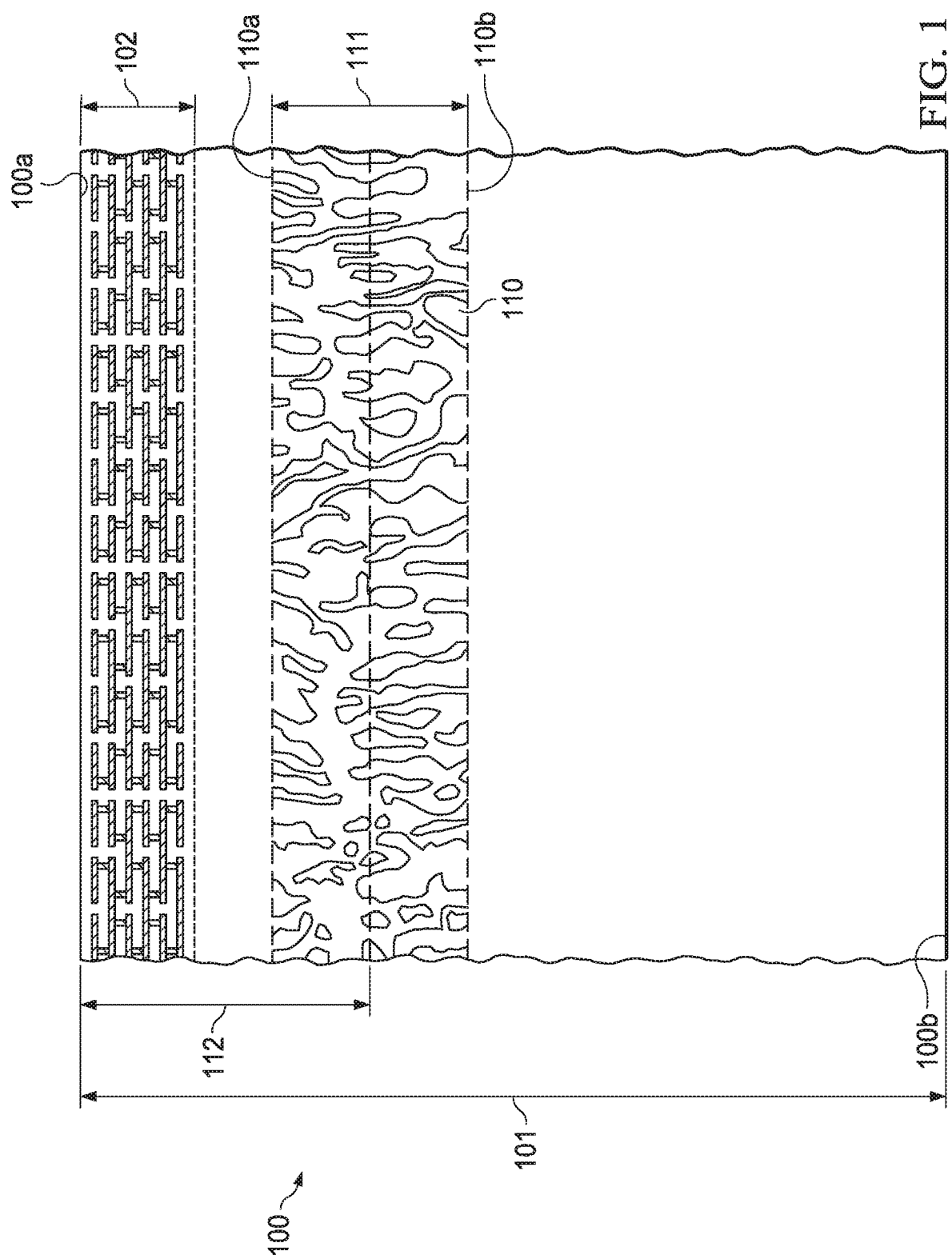
FIG. 1 shows a cross section of portion of a semiconductor chip with the integrated circuit zone close to the chip surface and the embedded zone of amorphous polysilicon for creating strain in the single-crystal lattice.

FIG. 1 illustrates as an exemplary embodiment of the invention the crystal alteration of a portion of a chip made of a single-crystalline semiconductor such as silicon; the chip portion is generally designated 100. Other bulk semiconductors include silicon germanium, gallium nitride, gallium arsenide, and any other compound used in fabrication of semiconductor devices. Chip 100 has a first surface 100a, a second surface 100b, and a thickness 101. In preferred embodiments, thickness 101 is in the range from about 70 μm to 150 μm (but may be thinner or thicker).

Close to first surface 100a is a zone with transistors and circuitry. This integrated circuit zone is referred to herein as first zone; it has a first depth 102 from first surface 100a. In exemplary FIG. 1, first depth 102 is between about 6 μm and 12 μm dependent on the number of metallization levels employed. In preferred embodiments, the first zone includes one or more field effect transistors (FETs) made according to MOS technology. The FETs may be nMOS or pMOS devices dependent on the conductivity type and the majority carrier of the bulk semiconductor.

FIG. 1 illustrates a second zone 110 of polycrystalline semiconductor with a high density of dislocations. In the exemplary embodiment of FIG. 1, second zone 110 has a height 111 of about 30 μm; in other embodiments, the height may be thicker or thinner. Second zone 110 further has borderlines 110a and 110b, which are substantially planar and parallel to chip surfaces 100a and 100b. The middle line of second zone 110 is spaced by a distance 112 from the chip surface 110a; in the example of FIG. 1, distance 112 is between about 30 μm and 50 μm; in other devices, it may be smaller or greater. In some devices borderline 110a may reach close to the borderline of the circuitry zone (first zone).

As described by the method below, the polycrystalline semiconductor of zone 110 is created from the single-crystalline bulk semiconductor by the optical damage caused in multi-photon absorption of the energy of a focused infrared laser, which has been directed towards, and is moving parallel to, the chip surface 100a. The amorphous poly-semiconductor creates a permanent intrinsic strain in the single-crystalline lattice near the zone of integrated circuitry with the FET structures. The strain, in turn, affects the mobility of the majority carriers in the gate channels of the FETs.

The strain of a lattice multiplied by the modulus of the material results in the stress in the lattice (mechanical stress is measured in pascals, Pa). Since lattice stress leads to splitting of the conduction band, the effective mass of a carrier can be altered; this effect results in changes of the carrier mobility. If the goal is to improve the carrier mobility, semiconductor devices of pMOS and nMOS technologies require different stress types, since the majority carriers are different; in nMOS devices, electrons are majority carriers, in pMOS devices, holes are the majority carriers.

Figure 2A:
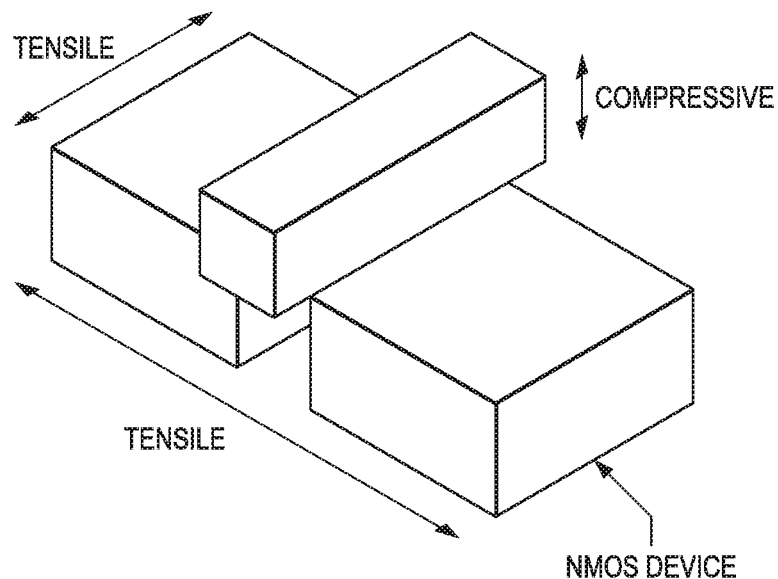
FIG. 2A is a schematic representation of the effect of stresses in an nMOS field effect transistor: Tensile stresses enhance electron mobility in the gate channel.
Figure 2B:
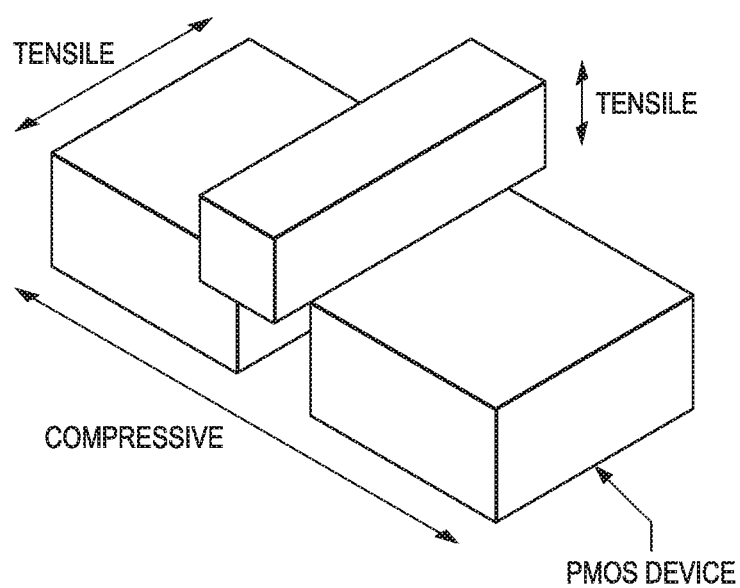
FIG. 2B is a schematic representation of the effect of stresses in a pMOS field effect transistor: Compressive stresses enhance hole mobility in the gate channel.

FIGS. 2A and 2B summarize the stress types necessary to improve majority carrier mobility in field effect transistors (FETs), schematically depicted to emphasize the channel between source and drain. As FIG. 2A shows, for an nMOS FET with electrons as majority carriers, tensile stress in the x-direction between source and drain can increase the electron mobility in the channel between source and drain. FIG. 2B depicts the corresponding situation for a pMOS FET; with holes as majority carriers, compressive stress in the x-direction between source and drain can increase the hole mobility in the channel between source and drain. In either case, increased carrier mobility is proportional to increased carrier speed and thus improved FET performance.

Figure 3:
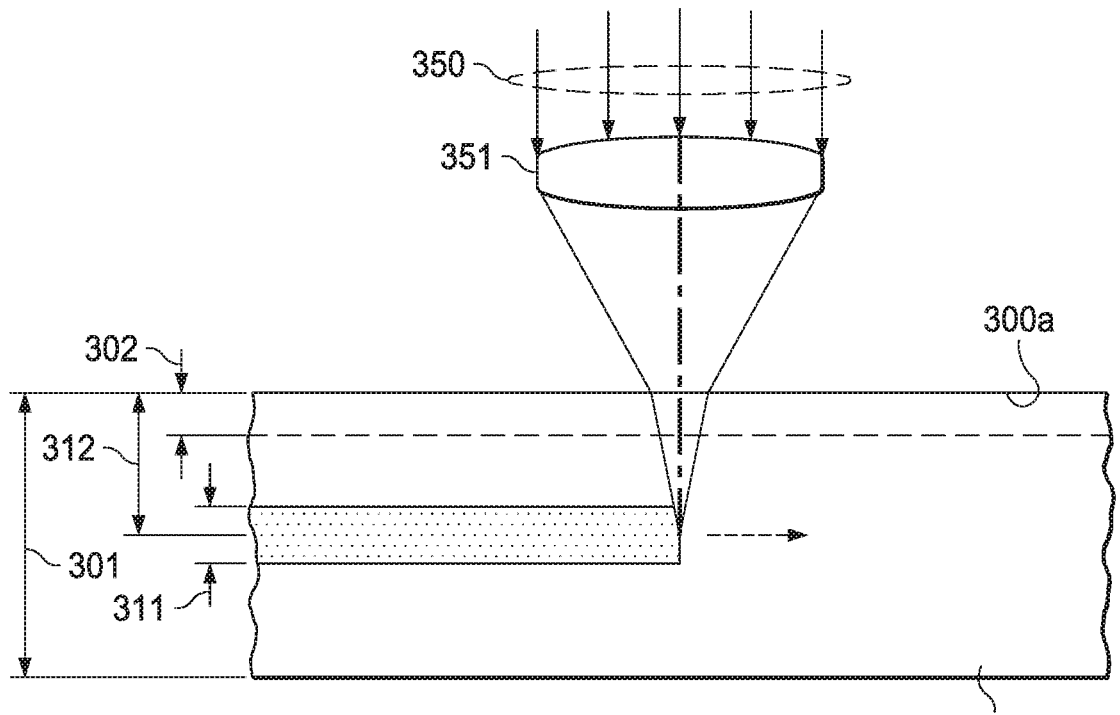
FIG. 3 illustrates the methodology of moving the focus of an infrared laser parallel to the surface of a single-crystalline semiconductor chip, creating a zone of amorphous semiconductor.
Figure 4:
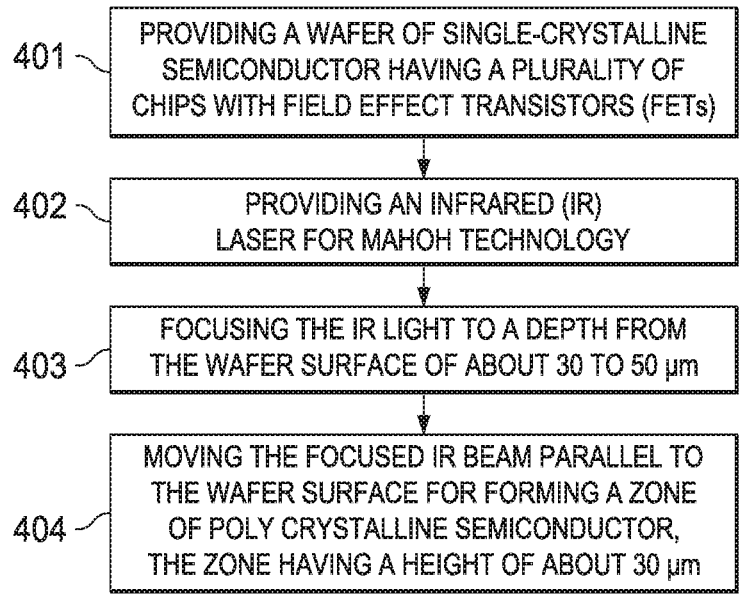
FIG. 4 shows the diagram of a process flow for using focused infrared laser light to create a zone of amorphous polysilicon embedded in single-crystal silicon.

Another embodiment is a method for creating the stresses in the semiconductor lattice to improve carrier mobility and thus the performance of transistors. The method is illustrated in FIG. 3 and summarized in FIG. 4. The method starts by providing a wafer 300 of a single-crystalline semiconductor (process 401). The wafer has a surface 300a and a plurality of device chips. The wafer has completed those front-end processes, which result in fabrication of field effect transistors (FETs) and circuitry in a zone of depth 302 from surface 300a. It should be noted that in FIG. 3, wafer 300 is shown having its final thickness 301 after the process of back-grinding; yet for practical reasons, the laser process to be described is preferably executed while the wafer still has its original thickness before back-grinding.

In process 402, an infrared (IR) laser is provided, which is suitable for stealth technology, also referred to as Mahoh technology. Suitable lasers are commercially available from a number of companies in the U.S., Japan, and other sources; a few of these companies are Hamamatsu, Disco, and Accretech. In the so-called stealth methodology, a laser is selected for its light operating according to a plot of Internal Transmittance (in %) as a function of the Wavelength (in nm). At IR wavelengths shorter than about 800 nm, the laser energy is high enough to be used for ablating an object, so that the transmittance is negligible (about 0%). This wavelength regime is often referred to as laser dicing. At wavelengths longer than about 1100 nm, the laser energy is weak enough to be transmitted through the object, so that the transmittance is about 100%. The wavelength regime is often referred to as stealth dicing.

As an example, in stealth technology, or Mahoh technology, the IR wavelength may be between 900 nm and 1000 nm, and the transmittance is in the range between 30% and 70%, and preferably about 50%. For the method illustrated in FIG. 3, the IR light is designated 350 and the focusing lens 351. An exemplary IR laser engine may produce 1.2 W pulsed power so that at the focal area the semiconductor bulk experiences internal modification by optical damage caused by multi-photon absorption. The focal area may be fixed to a typical size of about 15 μm diameter. The depth 312 of the focal area can be controlled working from the bottom of the semiconductor wafer up; in FIG. 3, the wafer of thickness 301 has the bottom at the wafer surface opposite surface 300a with the circuitry and transistors in first zone 302. The transformation of the single-crystalline semiconductor material into polycrystalline semiconductor with high density of dislocations occurs within second zone 311 and can be controlled by laser power, feed rate, and wavelength. For its effect on FETs and circuitry in first zone 302, the proximity of second zone 311 relative to first zone 302 may reach from just a few micrometers to about 50 μm.

As described, the IR light 350 of the laser falls into a range of wave lengths, which can readily be absorbed by the semiconductor lattice-under-discussion (preferably monocrystalline silicon). In process 403, a lens 351 focuses the IR light to a focal point, which is spaced from surface 300a with the FETs. For the example embodiment of FIG. 1, distance 312 may be in the 30 μm to 50 μm range. The energy of the laser light is absorbed by the single-crystalline semiconductor in so-called multi-photon absorption, which disturbs the single crystallinity of the lattice so that the resulting optical damage and energy absorption morphs the single-crystalline semiconductor into a polycrystalline and amorphous configuration within a zone of width 311. In the example of FIG. 1, width 311 is about 30 μm wide. The borders of second zone 311 are parallel to the wafer surface 300a and approximately planar. Zone 311 may be subdivided into sections with lateral dimensions smaller than the length of device chip. The high density of dislocations in the polycrystalline semiconductor exerts stress on the single-crystalline lattice of the semiconductor between zones 311 and 302. As mentioned above, this stress enhances the mobility of majority carriers in FETs positioned in suitable orientation.

In process 404, the focused infrared laser beam is moved parallel to the wafer surface 300a across wafer 300. This movement extends zone 311 of polycrystalline semiconductor in the direction parallel to surface 300a. For some devices, the movement thus the polycrystalline extension may be short, for other devices, however, the movement may extend across the whole wafer so that the polycrystalline zone extends across the whole length of each chip. In either case, the height of the polycrystalline zone is approximately 30 μm.

The laser movement may be repeated several times to widen the area of the polycrystalline zone (second zone), until the whole area of active circuitry is paralleled by a zone of polycrystalline semiconductor with an area sized to equal the circuitry area. The borders of the second zone are approximately planar and parallel to the wafer surface 300a.

After the second zone of polycrystalline semiconductor is created, a dicing process singulates wafer 300 into discrete device chips. Each chip includes a zone of polycrystalline semiconductor embedded in the single-crystalline bulk semiconductor.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies to any semiconductor material, including silicon, silicon germanium, gallium arsenide, gallium nitride, or any other semiconductor or compound material used in manufacturing.

As another example, the invention applies to any zone of polycrystalline semiconductor embedded in single-crystalline semiconductor, regardless of the geometries of the second zone (such as lateral dimensions, thickness, and planarity), the degree of poly-crystallinity, and the position of the second zone relative to the first zone of circuitry.

As another example, the semiconductor chip may be free of an encapsulation, or it may be in an additional package.

It is therefore intended that the appended claims encompass any such modifications or embodiments.

We claim:
1. A semiconductor device comprising:
a semiconductor die including a surface, a first zone and a second zone within the semiconductor die;
the first zone extending to a first depth from the surface, the first zone including field effect transistors; and
the second zone at a second depth, which is greater than the first depth, the second zone including a different crystalline structure than that of the first zone, wherein the second zone extends across two opposite side surfaces of the semiconductor die, the two opposite side surfaces being vertical to a plane parallel to the surface, and wherein the first zone includes a same crystalline structure within the first zone, and wherein the surface is a top most surface of the semiconductor device, wherein the polycrystalline semiconductor is created in response to a laser.

2. The semiconductor device of claim 1, wherein the second zone is aligned with the field effect transistors in a vertical direction, the vertical direction being perpendicular to a plane parallel to the surface.

3. The semiconductor device of claim 1, wherein the first zone includes a single-crystalline semiconductor.

4. The semiconductor device of claim 1, wherein the second zone includes a polycrystalline semiconductor.

5. The semiconductor device of claim 1, wherein the first zone is parallel to the surface.

6. The semiconductor device of claim 1, wherein the semiconductor die is in a package, the package being part of the semiconductor device.

7. The semiconductor device of claim 1, wherein the first depth is between about 6 μm and 12 μm.

8. The semiconductor device of claim 1, wherein the second depth is between 6 μm and 50 μm.

9. The semiconductor device of claim 1, wherein the second zone includes a side with a length across a plane parallel to the surface.

10. A semiconductor device comprising:
a semiconductor die including a surface, a first zone of polycrystalline semiconductor parallel to the surface, wherein the first zone includes a height, a length and a width; wherein the first zone extends across two opposite side surfaces of the semiconductor die, the two opposite side surfaces being vertical to a plane parallel to the surface; and
a package associated with the semiconductor die, wherein the first zone includes a same crystalline structure within the first zone, and wherein the surface is a top most surface of the semiconductor device.

11. The semiconductor device of claim 10, further comprising a second zone extending to a first depth from the surface, the first zone including field effect transistors and circuitry.

12. The semiconductor device of claim 10, wherein the first zone is below the second zone from a cross-sectional view of the semiconductor die.

13. The semiconductor device of claim 11, wherein the second zone includes single-crystalline semiconductor.

14. The semiconductor device of claim 10, wherein first zone of polycrystalline semiconductor is created in response to an exposure to an infra-red laser beam.

15. The semiconductor device of claim 10, wherein the height is about 30 μm.

16. The semiconductor device of claim 10, wherein the first zone includes a side with a length across a plane parallel to the chip surface.

* * * * *